US006225807B1

(12) United States Patent
Pohl

(10) Patent No.: US 6,225,807 B1
(45) Date of Patent: May 1, 2001

(54) METHOD OF ESTABLISHING THE RESIDUAL USEFUL LIFE OF CONTACTS IN SWITCHGEAR AND ASSOCIATED ARRANGEMENT

(75) Inventor: Fritz Pohl, Hemhofen (DE)

(73) Assignee: Siemens AG, Munich (DE)

( * ) Notice: Subject to any disclaimer, the term of this patent is extended or adjusted under 35 U.S.C. 154(b) by 0 days.

(21) Appl. No.: 09/117,630

(22) PCT Filed: Jan. 29, 1997

(86) PCT No.: PCT/DE97/00174

§ 371 Date: Mar. 3, 1999

§ 102(e) Date: Mar. 3, 1999

(87) PCT Pub. No.: WO97/28549

PCT Pub. Date: Aug. 7, 1997

(30) Foreign Application Priority Data

Jan. 31, 1995 (DE) .............................................. 196 03 319

(51) Int. Cl.[7] ...................................................... G01R 31/02

(52) U.S. Cl. ............................................. 324/423; 324/424

(58) Field of Search ..................................... 324/415, 423, 324/654, 71.1, 71.2, 421, 424; 340/638, 644

(56) References Cited

U.S. PATENT DOCUMENTS 3,988,664 * 10/1976 Beery et al. ......................... 324/423
4,780,786 * 10/1988 Weynachter ......................... 324/424
5,204,633 4/1993 Ahladas et al. ....................... 324/654
5,270,900 * 12/1993 Alden et al. ......................... 361/153
5,629,869 * 5/1997 Johnson et al. ........................ 702/34
5,668,693 * 9/1997 Tennies et al. ....................... 361/187
5,747,984 * 5/1998 Amft et al. .......................... 324/415

FOREIGN PATENT DOCUMENTS 36 32 169 4/1987 (DE) .
37 14 802 11/1988 (DE) .
40 28 721 3/1992 (DE) .
36 08 572 9/1994 (DE) .
44 17 694 11/1995 (DE) .
44 27 006 2/1996 (DE) .
44 33 209 3/1996 (DE) .
196 03 310 8/1997 (DE) .
694 937 1/1996 (EP) .

* cited by examiner

*Primary Examiner*—Safet Metjahic
*Assistant Examiner*—Vincent Q. Nguyen
(74) *Attorney, Agent, or Firm*—Kenyon & Kenyon

(57) ABSTRACT

To determine the remaining lifetime of contactor contacts, the contact spring action at the gap is determined as a substitute criterion for contact erosion, and to determine the erosion of the contacts, the change in spring action during a shutdown cycle is measured and converted to remaining lifetime. With a yoke and armature solenoid actuator with a solenoid, the armature path from the start of the armature movement to the start of contact opening must be measured. The time of separation of the armature from the yoke of the contactor solenoid actuator is determined from the voltage on the solenoid. The increase in magnetic resistance of the magnetic circuit when the magnetic armature is raised is determined. In the respective arrangement with an analyzing unit for determination and display of the remaining lifetime, the analyzing unit has means for detecting and measuring the voltage on the solenoid.

14 Claims, 8 Drawing Sheets

METHOD OF ESTABLISHING THE RESIDUAL USEFUL LIFE OF CONTACTS IN SWITCHGEAR AND ASSOCIATED ARRANGEMENT

FIELD OF THE INVENTION

The present invention relates to a method of determining the remaining lifetime of contacts of switchgear, in particular contactor contacts. In addition, the present invention also relates to the respective device with an analyzer for determining and displaying the remaining lifetime.

BACKGROUND INFORMATION

In German Patent Application No. 44 27 006 (not prior art) the remaining lifetime of a contactor in the disconnection operation is derived from the time difference between the start of the armature opening movement and the start of contact opening. Using an analysis algorithm, a microprocessor determines from the time difference the momentary value of the contact spring action, which decreases due to erosion from its new value (=100% remaining lifetime) to its minimum (=0% remaining lifetime).

The time signals required to do so are detected by interrupting an auxiliary current path over the armature and yoke of the solenoid actuator and on the basis of the contact voltage at the main contacts, and are converted to defined voltage pulses.

To simplify the contact voltage measurement, it is proposed according to German Patent Application No. 1 96 03 310.1 that contact opening, specifically in a three-phase system, be performed by monitoring the voltage, specifically at an artificial neutral point. This makes it possible to switch the device for determining the remaining lifetime as an independent add on unit in the load circuit between the contactor and the electric consumer, which is connected to the contactor with only one communication line for the opening of the armature-yoke contact.

SUMMARY OF THE INVENTION

An object of the present invention is to provide a method for determining the remaining lifetime independent of any modification of the contactor, specifically an armature-yoke contact, so that it can be used with any desired contactors.

This object is achieved according to the present invention with a method of the type defined in the preamble by detecting the time of separation of the armature from the yoke of the contactor solenoid actuator from the voltage on the solenoid. The increase in magnetic resistance of the magnetic circuit is advantageously detected when the magnet armature is raised. The voltage signal induced on the solenoid by the change in flux over time is used for the time measurement.

In the respective arrangement, the analyzer has means for detecting and measuring the voltage on the solenoid. These means are preferably units for signal rectification, signal contraction, signal shaping, and signal suppression and release.

The present invention is based on the following physical phenomena on disconnection of a contactor solenoid actuator: to generate the required armature closing force, a magnetic flux of a predetermined size is built up by the solenoid current in the ferromagnetic circuit. On disconnection of the control circuit, the solenoid becomes de-energized, and the magnetic flux in the closed ferromagnetic circuit decays a few milliseconds later due to remanence. The magnet armature begins to open at the moment when the magnetic closing force becomes less than the opening force, i.e., the sum of the spring forces of the contacts and the bridge carrier. When the magnet armature is raised, the magnetic resistance of the magnetic circuit increases suddenly, and the remaining magnetic flux $\Phi$ (Kmagn-$\Phi^2$) decays rapidly, and the change in flux over time induces a voltage signal on the solenoid.

DETAILED DESCRIPTION OF THE INVENTION

Figure 1:
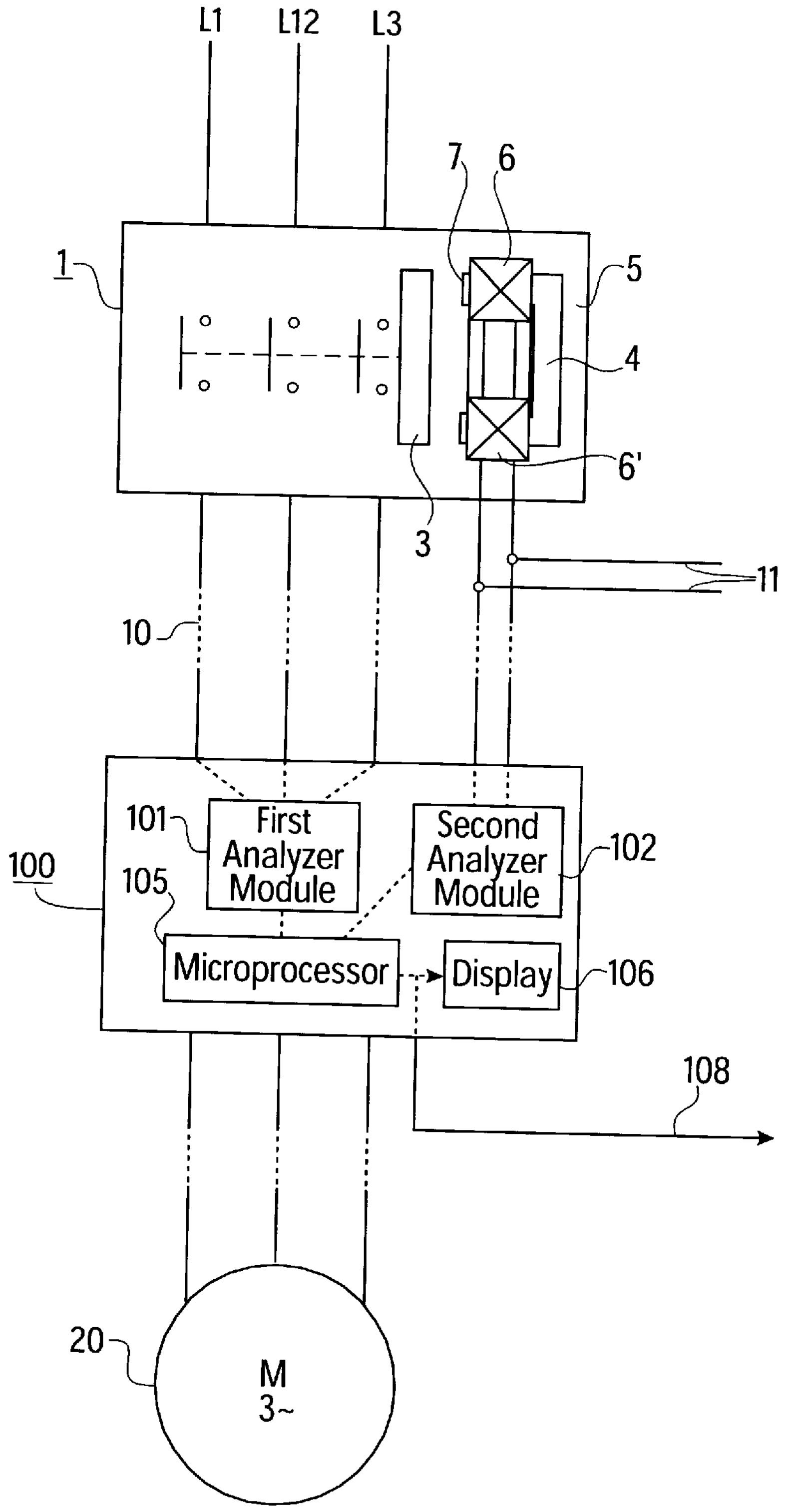
FIG. 1 is a block diagram of an arrangement for determining a remaining lifetime of contactors in the disconnection operation.

FIG. 1 shows a schematic diagram of the design and arrangement of a device 100 for determining the remaining lifetime of the main contacts of a contactor 1 in a three-phase system. This device is arranged on the load side between contactor 1 and a consumer 20, e.g., a three-phase motor. It contains a first analyzer module 101, preferably for detecting contact opening time $t_k$ of the first main contact to open, or as an alternative, for determining the contact opening times of each main contact. It also contains a second analyzer module 102 for detecting the start of armature movement which is also referred to as time $t_A$ of armature opening. The contact spring action is determined from time signals $t_A$ and $t_k$ by a microprocessor 105, and from this the remaining lifetime is determined and displayed on a display 106 and/or output over a data bus or for further analysis.

With its two measurement inputs, second analysis module 102 is connected to the terminals of the contactor solenoid and determines the time $t_A$ of the start of armature movement from the signal curve of the coil voltage during the disconnection operation.

Contactor 1 includes an electromagnetic drive 5. The electromagnetic drive 5 includes an armature 3 connected to the contact bridges of contactor 1, and a yoke 4. Yoke 4 has pole faces 7 and two coils 6 and 6', which can be electrically actuated.

In response to switching off electromagnetic drive 5 by interrupting the flow of current into coils 6 and 6', armature

3 is raised under the effect of opening spring forces not explicitly shown in FIG. 1, from pole faces 7 of yoke 4, and moves into its opening position.

Device 100 for determining the remaining lifetime of the main contacts is advantageously arranged on the load side of the switching device monitored, to monitor the contact opening of the switchgear monitored with a low level of technical complexity, as described in detail in a parallel patent application. However, device 100 may also be arranged on the infeed side of the switchgear monitored, and it may be integrated into various devices (e.g., overload relays) on the infeed side or the load side. Contact opening can be detected by measuring the contact voltages at the terminals of the individual switching poles over measuring terminals.

FIG. 2 shows measurement oscillograph charts of the coil voltage and the coil current on armature opening of a contactor in an arrangement modified for the measurement, where the armature and yoke close an auxiliary circuit when they contact one another and disconnect it when the armature is raised. A voltage pulse with a 50 V amplitude, lasting approx. 2 ms, is obtained at time $t_A$ of armature opening after disconnection time $t_{aus}$ because the rapidly decaying residual magnetic flux induces a voltage surge.

Figure 2B:
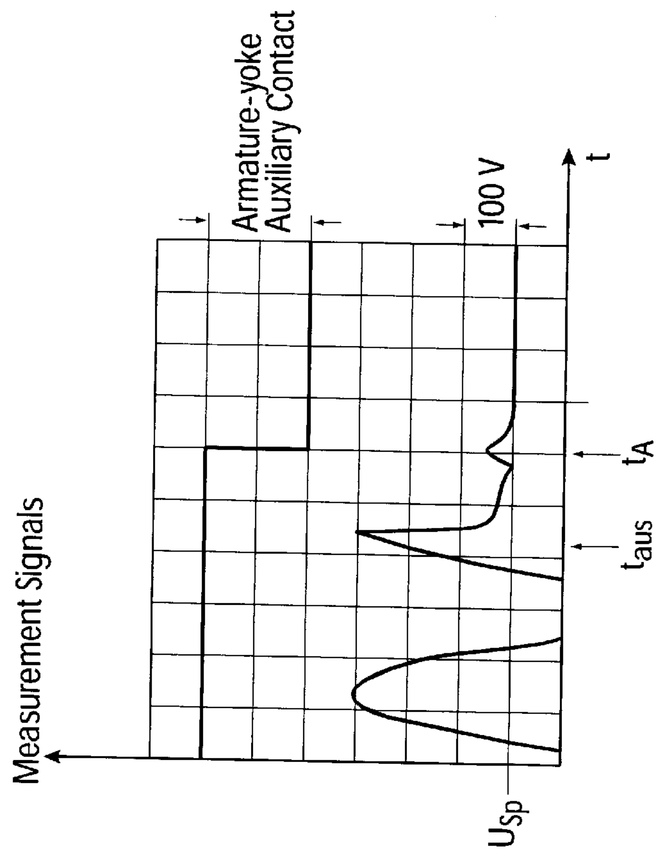
FIG. 2*b* shows another signal curve of the coil voltage and coil current as a function of time upon disconnection of the contactor in a.c. operation.
Figure 2A:
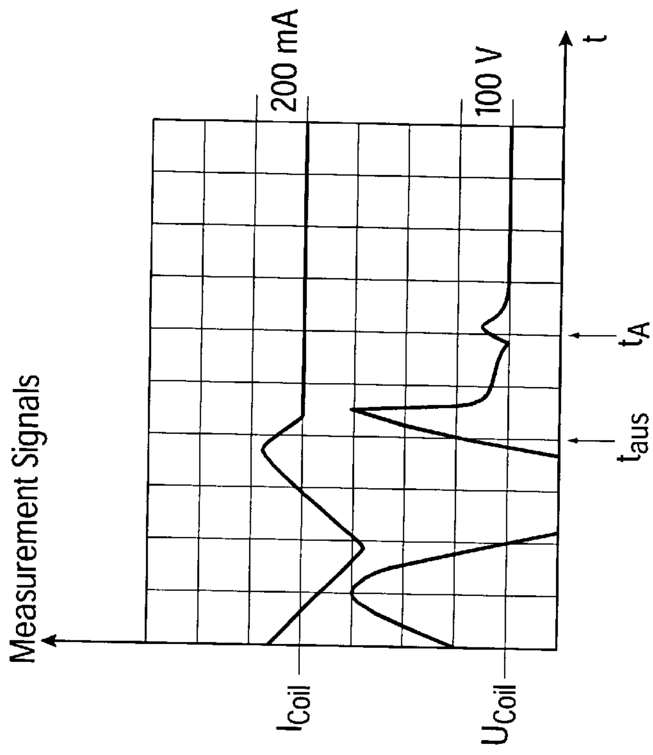
FIG. 2*a* shows a signal curve of the coil voltage and coil current as a function of time upon disconnection of a contactor in a.c. operation.
Figure 2D:
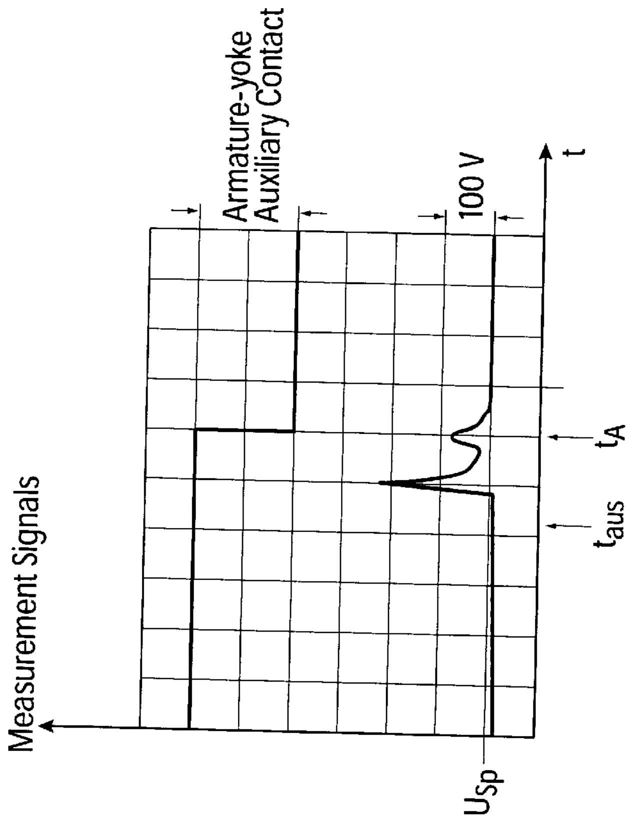
FIG. 2*d* shows a further signal curve of the coil voltage and coil current as a function of time upon disconnection of the contactor in d.c. operation.
Figure 2C:
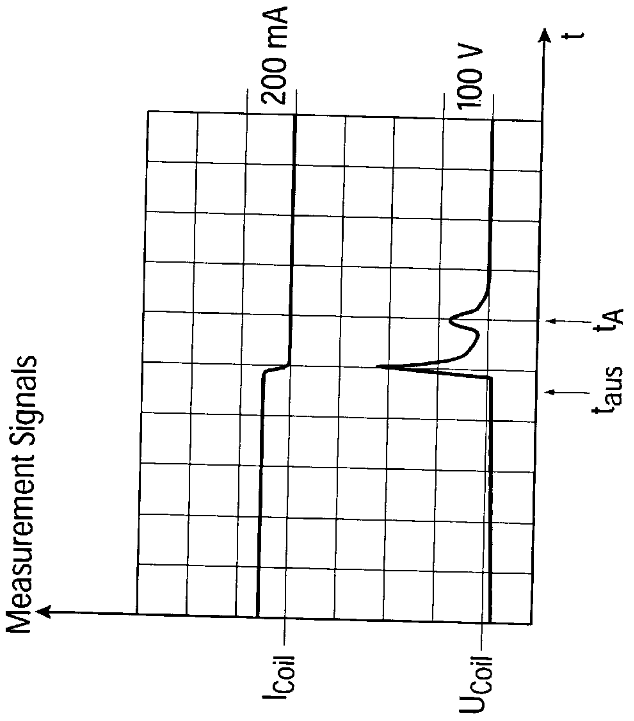
FIG. 2*c* shows yet another signal curve of the coil voltage and coil current as a function of time upon disconnection of the contactor in d.c. operation.

As shown by the individual oscillograph charts in FIGS. 2*a,* 2*b* for a.c. voltage and in FIGS. 2*c* and 2*d* for d.c. voltage, occurrence of the characteristic voltage pulse is independent of whether the holding current of the magnetic system is an a.c. current (e.g., 150 $mA_{eff}$) or a d.c. current (e.g., 150 mA=).

Contactor coils are usually wired to prevent switching surges in chopping of the arc current. Circuit elements include, for example, RC elements, varistors and, in the case of d.c. current, Zener diodes. It is impossible to detect the armature opening time from the coil voltage using RC interference suppression elements because when the coil current is disconnected, an excited RCL resonant circuit is created, and the coil voltage, as a decaying sinusoidal oscillation, does not have any significant signal curve for allocation to the armature opening time.

Figure 3:
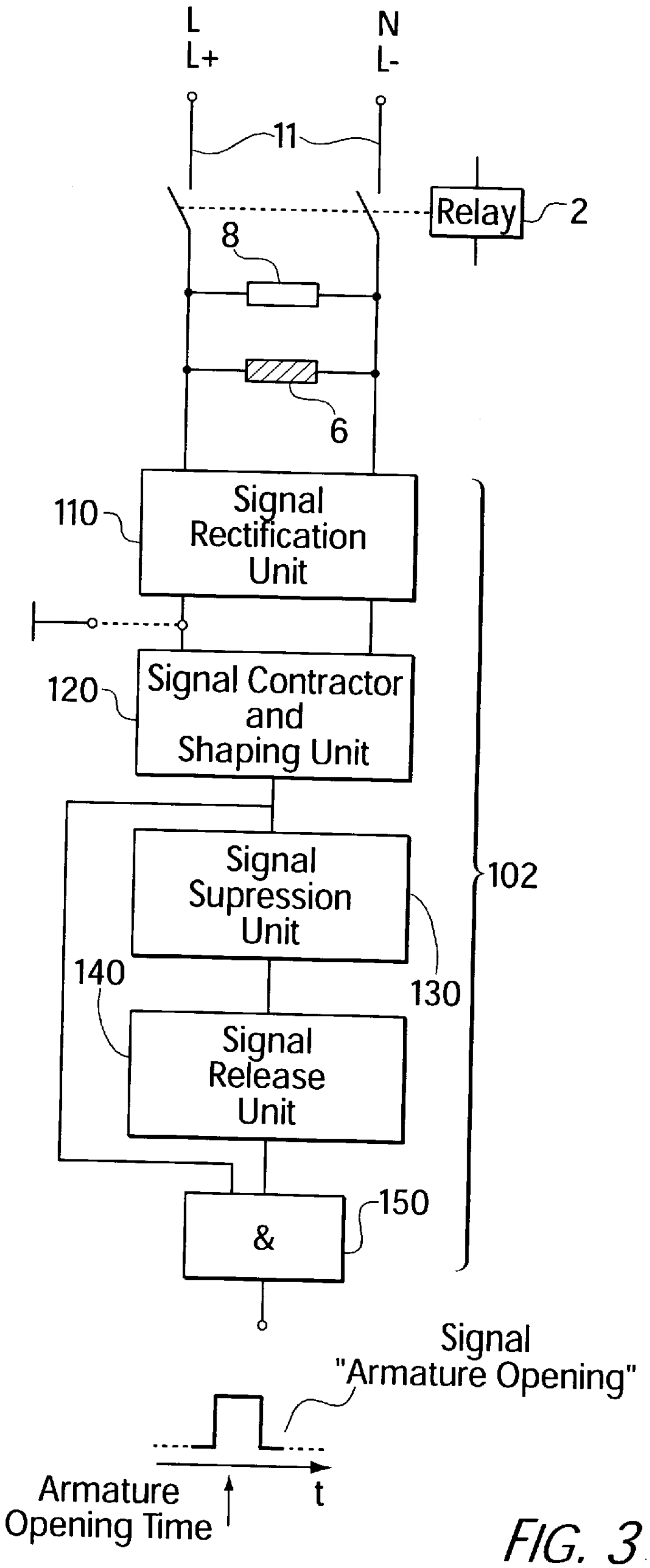
FIG. 3 shows a block diagram of an arrangement for analyzing the shutoff voltage according to FIGS. 2*a*–2*d*.

FIG. 3 shows a block diagram of a device for determining the time of armature opening from the shutoff voltage on solenoid 6 of a contactor 1. The contactor's magnetic system can be driven to advantage by a contactor relay 2 which connects or disconnects the control supply voltage to electromagnetic drive 5 (i.e. solenoid 5 of the contactor) with a double pole. The coil voltage is then separated from the potential of the control supply voltage at the time of armature opening.

The block diagram in FIG. 3 shows analyzer module 102 with a series connection of unit 110 for signal rectification, unit 120 for signal contraction and shaping, unit 130 for signal suppression and unit 140 for signal release. The output signals from units 120 and 140 are sent to an AND element 150 which outputs the desired armature opening time accurately. In particular because of the required accurate determination of the small intervals, a corresponding design of units 110 through 140 with components adapted to the task is necessary.

With the coil voltage signal processing proposed here—i.e., rectification, contraction/shaping, suppression and release—an output pulse is created and coincides in time with the characteristic voltage pulse (e.g., pulse width≈2 ms, pulse amplitude≈50 V in FIG. 2) which occurs when the armature is separated from the yoke. For further signal processing, an output signal which can be derived from the output pulse, e.g., using an optocoupler (not shown in FIG. 3), and is electrically isolated from the power supply system of the contactor solenoid actuator (i.e. contactor drive).

Figure 4:
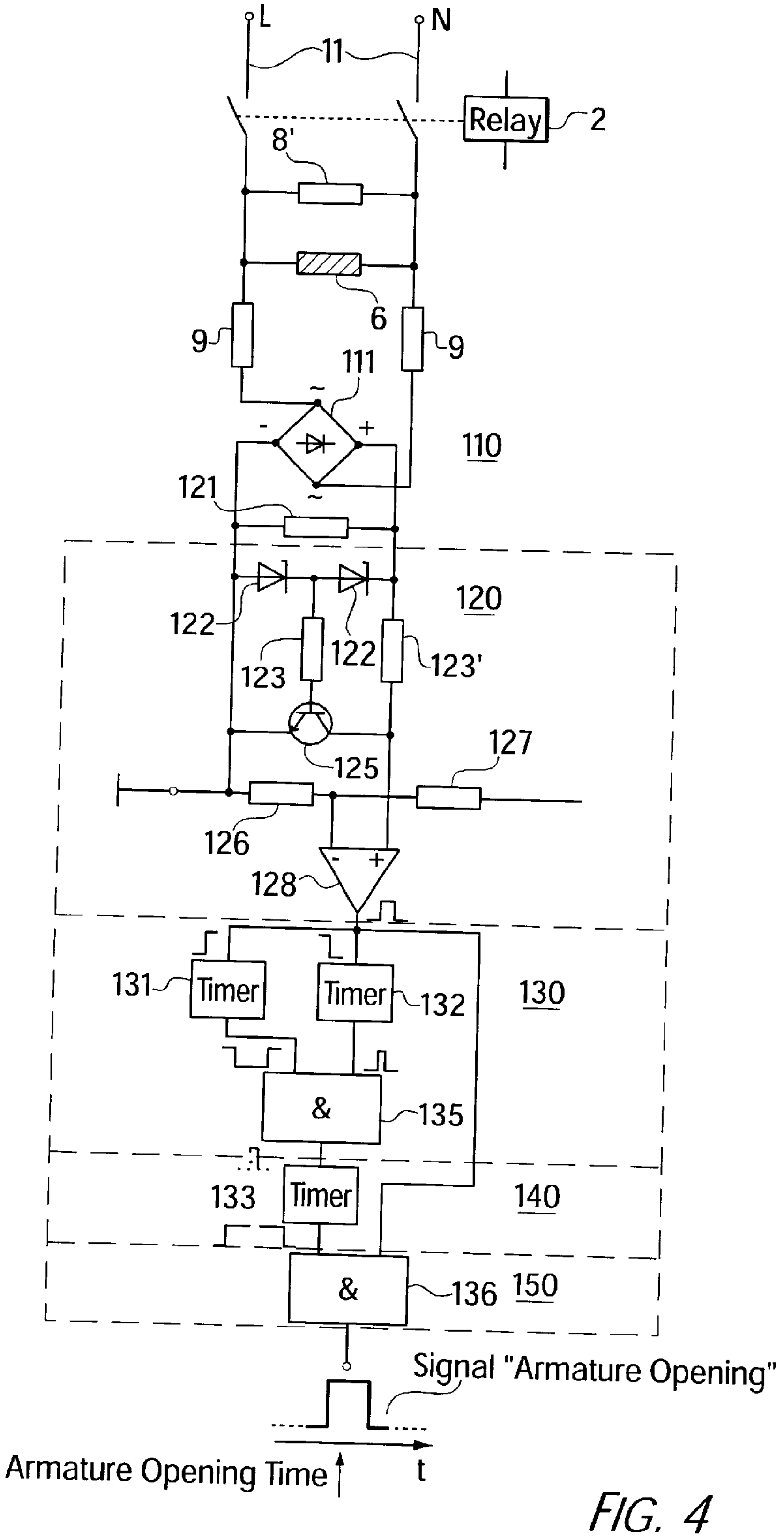
FIG. 4 shows an exemplary embodiment of FIG. 3 in a circuit.

FIG. 4 shows a concrete wiring example of an analysis circuit for detecting the time of armature opening with components 111 through 136 which are self-explanatory for the design of units 110, 120, 130, 140. The circuit is connected to the measuring leads for monitoring the voltage on solenoid 6, 6' of electromagnetic drive 5 of FIG. 1. Both measuring terminals contain the same series resistor 9 for voltage dividing of the measuring signal to obtain a free terminal assignment on electromagnetic drive 5. The measuring ground is connected to the protective ground and is practically at zero potential, so that a measured current flows into the analysis circuit only from external conductor L during the on state of the contactor relay.

A characteristic measuring signal is generated by signal rectification and the limiter circuit. In the on state of the contactor solenoid actuator, this signal contains short voltage pulses with a width of 300 μs, for example, and an interval of 10 ms at a 50 Hz a.c. voltage, while two voltage pulses of approximately 2 ms long with an interval of a few milliseconds are formed in the shutdown cycle, with the first pulse characterizing the drop in induction in the iron core, while the second pulse is generated by the armature lifting away from the yoke and the related change in induction.

In the following part of the electronic circuit, all the voltage pulses except for the one mentioned above are suppressed, so that the analysis circuit supplies only a single output pulse which coincides in time with the start of opening of the armature.

Figure 5A:
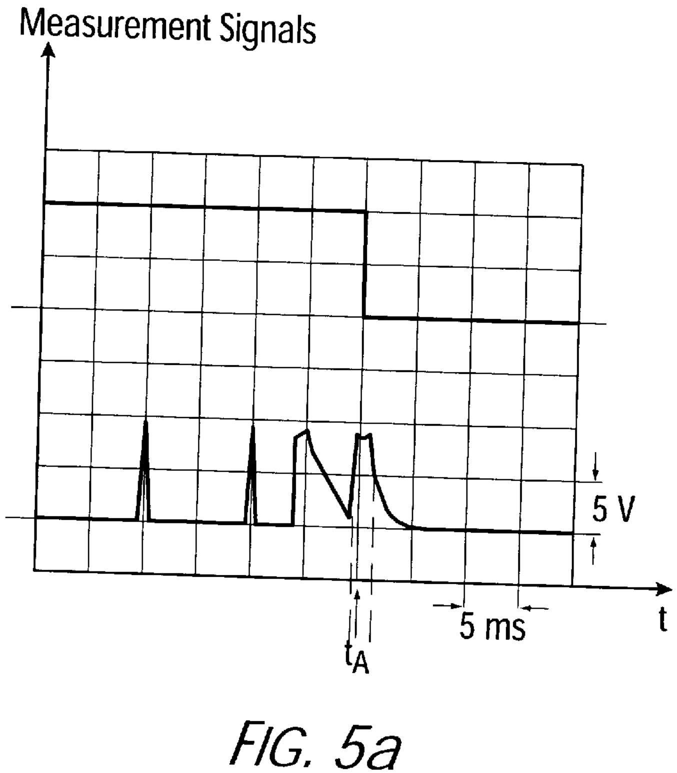
FIG. 5*a* shows an oscillograph chart of a signal voltage at the time of armature opening.
Figure 5B:
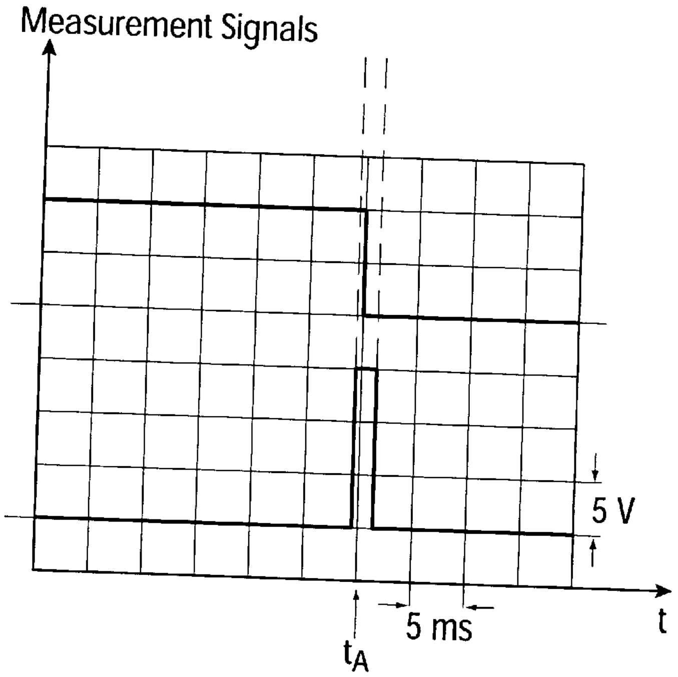
FIG. 5*b* shows another oscillograph chart of the signal voltage at the time of armature opening.

FIG. 5 shows measurement oscillograph charts of the analysis circuit according to FIG. 4. The armature-yoke auxiliary contact of the modified contactor was used to determine the time of the start of armature opening electrically/mechanically and compare it with the output signal of the analysis circuit. By signal averaging of the time signals $t_A$ and $t_k$ it is possible to largely eliminate time fluctuations caused by contact separation of the contactor main contacts affected by mechanical tolerances and caused by different magnetization states of the contactor solenoid actuator, so that the averaged time difference between the start of the armature opening movement and the start of contact opening is detected with a measurement accuracy of ±100 . . . 200 μs.

Figure 6:
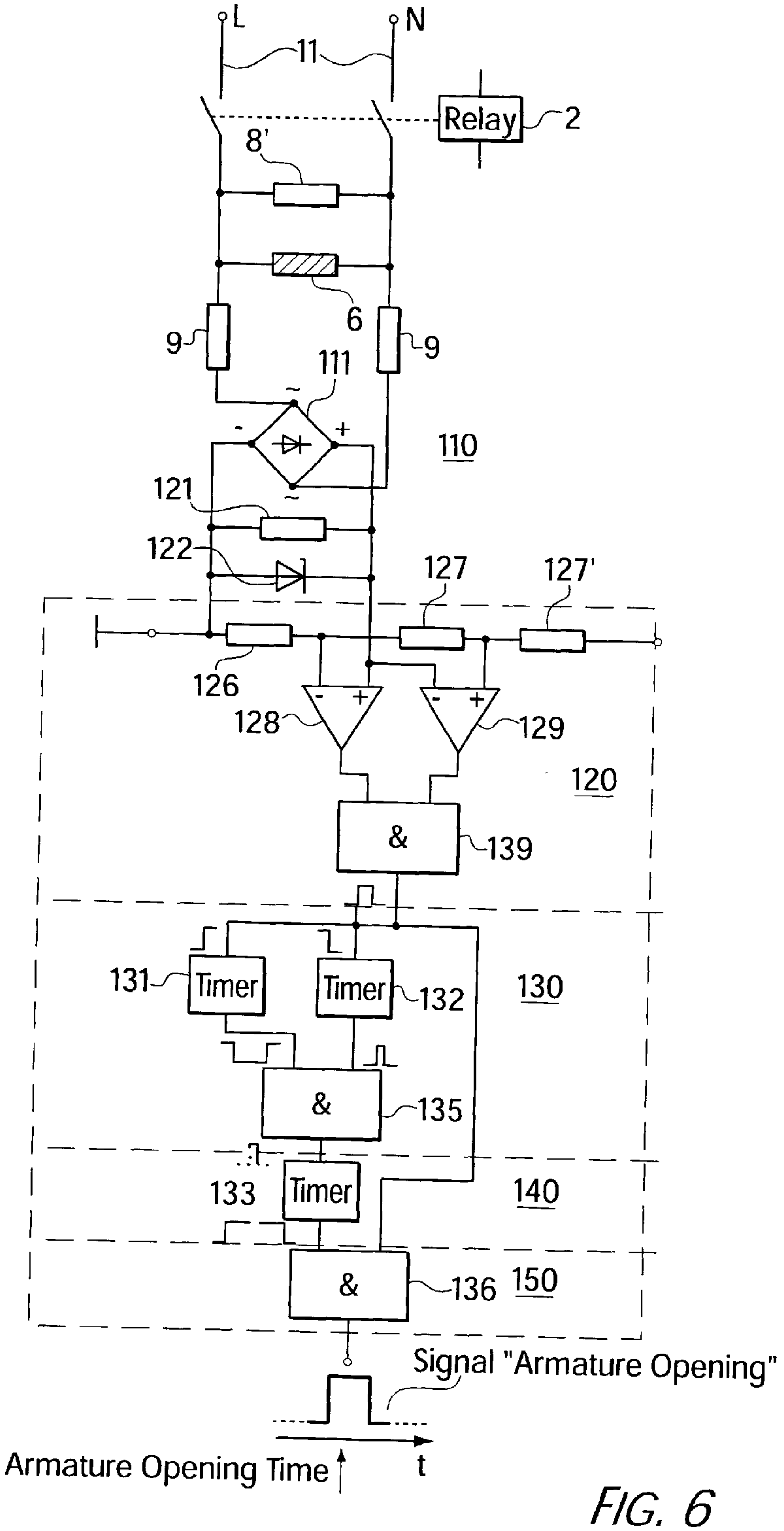
FIG. 6 shows another exemplary embodiment of FIG. 4 in a circuit.

FIG. 6 shows another exemplary analysis circuit for detecting the time of armature opening. It differs from the circuit shown in FIG. 4 only in the circuit part for signal contraction and shaping, in particular due to the high input resistance of comparators 128 and 129. The analysis circuit therefore processes the measurement signal from the contactor coil in the same way, regardless of whether or not the ground terminal of the electronics power supply voltage is at ground potential. In addition, detection of the time of armature opening is also possible with a single-pole interruption of the coil voltage.

The circuit according to FIG. 6 can therefore be used with a.c. voltage as well as d.c. voltage. For example, electric separation of the output signal from the power supply network of the contactor solenoid actuator is to be provided for further signal processing with an optocoupler, for example.

Figure 7:
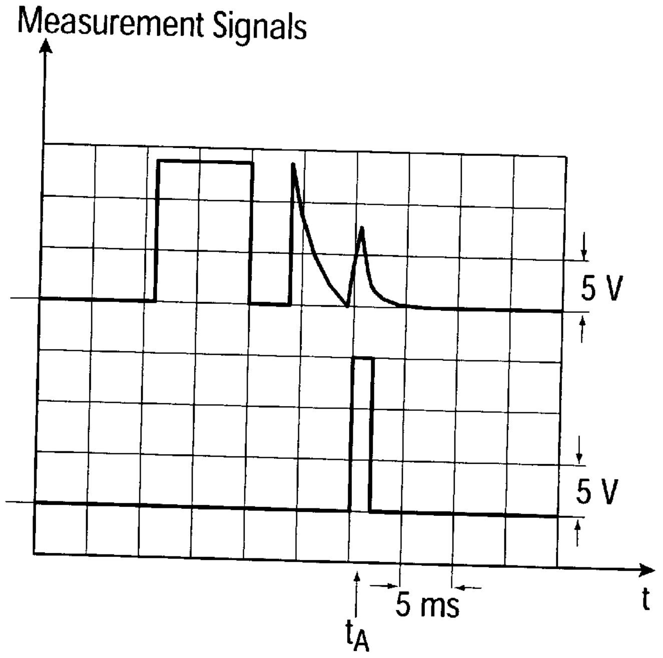
FIG. 7 shows an oscillograph chart of the signal voltage occurring on disconnection of the contactor coil.

FIG. 7 shows measurement oscillograph charts of the analysis circuit according to FIG. 6, with the electronic frame potential here being at ground potential. This yields comparable output signals with the same measurement accuracy as with the circuit according to FIG. 4.

Accurate allocation of armature opening time $t_A$ to the "armature opening pulse" of the analysis circuit according to FIGS. 4 and 5 can be accomplished by taking into account a contactor-specific and circuit-specific time offset, counting from the rising edge of the "armature opening pulse," e.g., 0.7 ms with the above type of contactor. Depending on the contactor design and the voltage level of the control supply voltage, it may be necessary to adapt the circuit part for signal contraction.

Figure 8:
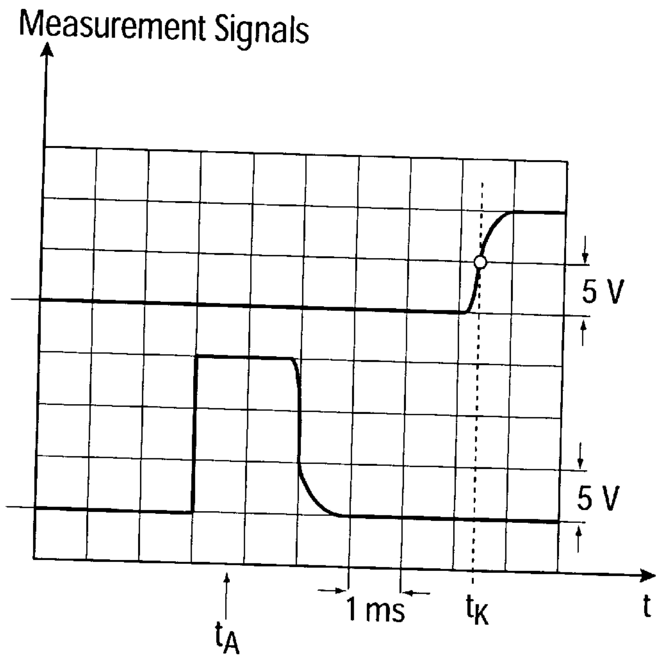
FIG. 8 shows an oscillograph chart with the measurement of the time difference between the start of armature opening and the start of contact opening in disconnection of a standard a.c. -operated contactor with averaging.

FIG. 8 shows the signal curve of armature opening time $t_A$ of the analysis circuit and the contact opening time of a standard contactor, again using averaging.

Signal averaging over 64 circuits, where the positive edge of the armature opening pulse is the trigger time, shows a weak scattering in the width of the armature opening pulse and a time scattering in the contact opening time of approximately 0.5 ms. The average interval from the start of armature opening $t_A$ to the start of contact opening $t_k$ can be given as 4.6 ms±0.2 ms in the measured example.

The analysis circuit described here for detecting the time of armature opening may be part of an analyzing unit for determining the remaining lifetime of contactor main contacts. The analyzing unit is on the load side between the contactor and the electric consumer, and it is contacted via a first monitoring module for detecting contact opening from the change in voltage at an artificial neutral point with external conductors L1, L2, L3. A signal line, in particular one with two wires, connects the terminals of the contactor coil with a second monitoring module for detection of armature opening. The microprocessor determines the momentary contact spring action from the time signals of armature opening $t_A$ and contact opening $t_k$ supplied by the monitoring modules, and then determines the remaining electric lifetime of the main contact members from this contact spring action.

What is claimed is:

1. A method for determining a remaining lifetime value of contacts in a switchgear, comprising the steps of:

determining a contact spring action at a beginning of a parting of the contacts;

during a shutdown cycle, measuring each change in the contact spring action to determine an erosion of contact points, including the steps of:

measuring a run-time value of an armature path from a first start of an armature movement in a contactor solenoid actuator to a second start of an opening of a contact, the contactor solenoid actuator including a yoke and an armature, the yoke having a solenoid, the second start of the opening of the contact being determined by measuring a voltage rise of the contact, the first start of the armature movement being determined by measuring a voltage of the solenoid to determine a time of separation of the armature from the yoke, determining a length of the armature path as a function of the run-time value, and determining the change in contact spring action by a change in the length of the armature oath;

determining an erosion of the contacts as a function of the change in the contact spring action; and determining the remaining lifetime value using the erosion.

2. The method according to claim 1, wherein the contacts are contactor contacts.

3. The method according to claim 1, further comprising the step of:

when the armature is raised, detecting an increase in a magnetic resistance of a magnetic circuit, the magnetic circuit including the yoke, armature and solenoid, the time of separation being determined as a function of the increase in the magnetic resistance.

4. The method according to claim 3, further comprising:

measuring the time of separation as a function of the voltage of the solenoid induced a change in a flux of the solenoid over a time period.

5. An arrangement for determining a remaining lifetime value of contacts in a switchgear, comprising:

an analyzing unit determining and displaying of the remaining lifetime value, the analyzing unit including a first arrangement detecting and measuring a voltage on a solenoid, the first arrangement configured to preform the steps of determining a contact siring action at a beginning of a parting of the contacts;

during a shutdown cycle, measuring each change in the contact spring action to determine an erosion of contact points, including the steps of measuring a run-time value of an armature path from a first start of an armature movement in a contactor solenoid actuator to a second start of an opening of a contact, the contactor solenoid actuator including a yoke, an armature, and the solenoid, the second start of the opening of the contact being determined by measuring a voltage rise of the contact, the first start of the armature movement being determined by measuring the voltage of the solenoid to determine a time of separation of the armature from the yoke, determining a length of the armature path as a function of the run-time value, and determining the change in contact spring action by a change in the length of the armature path;

determining an erosion of the contacts as a function of the change in the contact spring action; and determining the remaining lifetime value using the erosion.

6. The arrangement according to claim 5, wherein the contacts are contactor contacts.

7. The arrangement according to claim 5, wherein the analyzing unit is integrated into the switchgear.

8. The arrangement according to claim 5, wherein the analyzing unit is coupled to the switchgear.

9. The arrangement according to claim 5, wherein the analyzing unit is arranged in an overload relay on a load side of the switchgear.

10. The arrangement according to claim 5, wherein the analyzing unit is arranged on a load side of the switchgear.

11. The arrangement according to claim 5, wherein the first arrangement includes a first device for rectifying a signal, a second device for contracting and shaping the signal, a third device for suppressing the signal, and a fourth device for releasing the signal.

12. The arrangement according to claim 11, wherein each of the first device, second device, third device and fourth device includes a respective discrete circuit for generating a time signal for a time of an armature opening.

13. The arrangement according to claim 11, wherein the third device includes a plurality of timers.

14. The arrangement according to claim 13, wherein each of the plurality of timers is coupled to another one of the plurality of timers using at least one AND device.

* * * * *